United States Patent
Bian et al.

(10) Patent No.: US 11,422,474 B1
(45) Date of Patent: Aug. 23, 2022

(54) DYNAMIC ILLUMINATION METHOD BASED ON SCAN EXPOSURE MACHINE

(71) Applicant: Shanghai Huali Integrated Circuit Corporation, Shanghai (CN)

(72) Inventors: Yuyang Bian, Shanghai (CN); Lulu Lai, Shanghai (CN); Xiaobo Guo, Shanghai (CN); Cong Zhang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 17/575,848

(22) Filed: Jan. 14, 2022

(30) Foreign Application Priority Data

Jun. 28, 2021 (CN) .......................... 202110718865.1

(51) Int. Cl.
*G03F 7/20* (2006.01)

(52) U.S. Cl.
CPC .......... *G03F 7/70508* (2013.01); *G03F 7/702* (2013.01); *G03F 7/70033* (2013.01); *G03F 7/7055* (2013.01); *G03F 7/70125* (2013.01); *G03F 7/70258* (2013.01)

(58) Field of Classification Search
CPC ............... G03F 7/7055; G03F 7/70033; G03F 7/70258; G03F 7/70; G03F 7/70058; G03F 7/70091–70116; G03F 7/70125; G03F 7/70141; G03F 7/7015; G03F 7/70166; G03F 7/702; G03F 7/70208; G03F 7/70283; G03F 7/70291; G03F 7/70325; G03F 7/70375; G03F 7/70425–70441; G03F 7/70483–70541; G03F 7/70475
USPC .......... 355/30, 52–55, 67–77; 430/5, 22, 30; 716/50–56
See application file for complete search history.

(56) References Cited

U.S. PATENT DOCUMENTS

| | | | | |
|---|---|---|---|---|
| 2006/0142967 | A1* | 6/2006 | Hoeks | G03F 7/70508 702/117 |
| 2010/0315614 | A1* | 12/2010 | Hansen | G03F 7/70441 355/77 |
| 2014/0307245 | A1* | 10/2014 | Tanaka | G03F 7/70566 355/71 |
| 2021/0232748 | A1* | 7/2021 | Hsu | G03F 1/70 |

* cited by examiner

*Primary Examiner* — Christina A Riddle
(74) *Attorney, Agent, or Firm* — Banner & Witcoff, Ltd.

(57) ABSTRACT

The present application provides a dynamic illumination method based on a scan exposure machine, providing a mask used for exposure and a GDS file corresponding to the mask; dividing pattern information on the mask into n areas with the same width along the direction of movement of the mask during the exposure; performing SMO computation on the pattern information in the n areas, so as to generate n SMO files corresponding to the n areas respectively; performing combinatorial optimization on the n SMO files to obtain a DSMO file; generating a driver of a light source reflector array according to the DSMO file, the illumination; and controlling a reflector array of an exposure machine by calling the driver of the light source reflector array. The DSMO method is performed in each exposure slit area, so as to improve the illumination optimization for a pattern.

9 Claims, 4 Drawing Sheets

Step 1. A mask used for exposure and a GDS file corresponding to the mask are provided Step 2. According to data in the GDS file, pattern information on the mask is divided into n areas S1-Sn with the same width along the direction of movement of the mask during the exposure, wherein, Y1 is the length of the mask, and Y2 is the width of a light-transmitting slit in the exposure Step 3. SMO computation is performed on the pattern information in the n areas S1-Sn, so as to generate n SMO files SMO1-SMO2 corresponding to the n areas S1-Sn respectively Step 4. Combinatorial optimization is performed on the n SMO files SMO1-SMO2 to obtain a DSMO file Step 5. A driver of a light source reflector array is generated according to the DSMO file, the illumination, and a movement speed of a wafer, wherein k represents the number of reflectors, , , and respectively represent angles between the k-th reflector and the x, y, and z axes in the three-dimensional coordinate system Step 6. A reflector array of an exposure machine is controlled by calling the driver of the light source reflector array, so as to achieve illumination

FIG. 7

DYNAMIC ILLUMINATION METHOD BASED ON SCAN EXPOSURE MACHINE

CROSS-REFERENCES TO RELATED APPLICATIONS

This application claims priority to Chinese patent application No. 202110718865.1, filed on Jun. 28, 2021, the disclosure of which is incorporated herein by reference in its entirety.

TECHNICAL FIELD

The present application relates to the technical field of semiconductors, in particular to a dynamic illumination method based on a scan exposure machine.

BACKGROUND

The lithography machine is the most important device in the field of semiconductor manufacturing lithography. The lithography machine undergoes considerable progress from the initial contact exposure to the step-scan exposure. Currently, the critical layer of each advanced manufacturing process adopts a scan exposure machine. The contact exposure can duplicate each pattern on an entire mask onto a silicon wafer at a 1:1 ratio via one time of exposure. In addition to a lens assembly, a slit is also provided between a light source and a mask of a scan exposure system; light passing through the slit irradiates a mask and then is projected onto a silicon wafer to complete the exposure. The light source, the light-transmitting slit, and the lens assembly are fixed, and a pattern on the mask is duplicated to the silicon wafer via the movement of a mask carrier, in which case a silicon wafer carrier moves relative to the mask. Since the size ratio between the mask pattern of the exposure machine and the silicon wafer pattern currently is 4:1, the movement speed of the silicon wafer carrier is ¼ of the movement speed of the mask carrier.

In formulation of the lithography process, the first thing to do is to determine illumination conditions according to pattern design requirements. At present, common illumination modes include: conventional illumination, annular illumination, dipole illumination, quadra illumination, and source-mask optimization (SMO) illumination. The first four types of illumination are implemented by diffractive optical elements, each having a regular shape and a symmetrical configuration, while the SMO illumination has a relatively random shape and cannot be implemented by a regular optical element. The SMO illumination is implemented by reflectors, wherein thousands of reflectors are generally required and configured by a programmable illumination system. The position of each reflector can be adjusted independently, so that the light of the reflector can reach any position, thereby forming complex SMO illumination. The SMO illumination is the optimal illumination computed on the basis of a design pattern on a mask. Since there are various patterns on the mask, comprehensive consideration of the various patterns is required in the computation process so that each pattern on the entire mask has a certain lithography process window, which means that the optimal illumination computed by SMO is not optimal for a certain pattern on the mask.

From the perspective of a circuit design, although there are various patterns on the mask, patterns in different areas are not randomly assigned. Different chips are carried on different areas of a mask of a Multi-product Wafer (MPW) product, and different types of chips necessarily have different internal patter designs. Generally, a chip used for storage (SRAM) has a denser pattern and a smaller line width and is closer to the process limit; a chip used for logic operation has a smaller pattern density and a complex pattern arrangement, and in particular, an isolated pattern has a narrower lithography process window. The above problems also exist in normal products, wherein the chips correspond to different areas in a die, such as a storage area or a logic operation area. Such the special distribution of the patterns on the mask provides the possibility to further optimize the lithography illumination.

BRIEF SUMMARY

In view of the above-mentioned defect of the prior art, the object of the present application is to provide a dynamic illumination method based on a scan exposure machine, so as to solve the problem of how to enlarge a lithography process window with a further reduction of a pattern size in the prior art.

In order to achieve the above object and other related objects, the present application provides a dynamic illumination method based on a scan exposure machine, at least comprising the following steps:

step 1: providing a mask used for exposure and a graphic design system (GDS) file corresponding to the mask;

step 2: according to data in the GDS file, dividing pattern information on the mask into n areas S1-Sn with the same width along a direction of movement of the mask during the exposure, wherein $$n = \frac{Y1}{Y2},$$

Y1 is a length of the mask, and Y2 is a width of a light-transmitting slit in the exposure;

step 3: performing SMO computation on the pattern information in the n areas S1-Sn, so as to generate n SMO files SMO1-SMO2 corresponding to the n areas S1-Sn respectively;

step 4: performing combinatorial optimization on the n SMO files SMO1-SMO2 to obtain a dynamic source mask optimization (DSMO) file;

step 5: generating a driver $(R_x^1, R_y^1, R_z^1)$, $(R_x^2, R_y^2, R_z^2)$, ..., $(R_x^k, R_y^k, R_z^k)$ of a light source reflector array according to the DSMO file, the illumination, and a movement speed of a wafer, wherein k represents a number of reflectors, $R_x^k$, $R_y^k$, and $R_z^k$ respectively represent angles between a k-th reflector and x, y, and z axes in a three-dimensional coordinate system; and step 6: controlling a reflector array of an exposure machine by calling the driver of the light source reflector array, so as to achieve illumination.

In some examples, two adjacent areas in step 2 have an overlap area in the width direction thereof, and the width of the overlap area is 1%-10% of the width of each area.

In some examples, the width of the overlap area in step 2 is 5% of the width of each area.

In some examples, the combinatorial optimization is performed on the n SMO files SMO1-SMO2 via a server side in step 4, so as to obtain the DSMO file.

In some examples, the server side in step 4 specifies unit point illuminations of two adjacent SMO illuminations, and lateral and longitudinal movement ranges of the two unit point illuminations do not exceed 10% of the radius of the outermost unit point illumination in the two unit point illuminations.

In some examples, a reflector array servo system in a lithography machine generates the driver of the reflector array in step 5.

In some examples, the driver of the light source reflector array in step 5 defines a reflector rotation range ($\Delta R_x$, $\Delta R_y$, $\Delta R_z$) of two adjacent SMO illuminations as 0-5 degrees.

In some examples, the driver of the light source reflector array in step 5 defines a reflector rotation range ($\Delta R_x$, $\Delta R_y$, $\Delta R_z$) of two adjacent SMO illuminations as 1 degree.

In some examples, the exposure machine in step 6 is a deep ultraviolet (DUV) or extreme ultraviolet (EUV) machine.

As described above, the dynamic illumination method based on a scan exposure machine of the present application has the following beneficial effects: the DSMO method of the present application is performed in each exposure slit area, so as to further improve the illumination optimization for a pattern, thereby enlarging a lithography process window and reducing the lithography cost. In particular, in the vicinity of the diffraction limit, in order to expose a pattern having a smaller size, it is necessary to split a mask into several portions. The DSMO may even reduce the number of masks by enlarging the lithography process window.

BRIEF DESCRIPTION OF THE DRAWINGS

FIG. 7 is a flowchart of a dynamic illumination method based on a scan exposure machine in the present application.

DETAILED DESCRIPTION OF THE DISCLOSURE

The implementation of the present application is described below with specific examples, and those skilled in the art can easily understand other advantages and effects of the present application from the content disclosed in the description. The present application can also be implemented or applied in other different specific embodiments, and various details in the description can also be modified or changed on the basis of different viewpoints and applications without departing from the spirit of the present application.

Please refer to FIG. 1 to FIG. 7. It should be noted that the drawings provided in the embodiments only schematically illustrate the basic concept of the present application. The drawings only show the components related to the present application but are not drawn according to the number, shape, and size of the components in actual implementation. The type, quantity, and proportion of each component can be changed at random during actual implementation, and the component layout may be more complicated.

The present application provides a dynamic illumination method based on a scan exposure machine. Referring to FIG. 7, FIG. 7 is a flowchart of the dynamic illumination method based on a scan exposure machine in the present application. The method at least includes the following steps:

Step 1. A mask used for exposure and a GDS file corresponding to the mask are provided. The mask contains pattern information used for exposure, and the GDS file is data corresponding to the pattern information on the mask.

Step 2. According to data in the GDS file, pattern information on the mask is divided into n areas S1-Sn with the same width along the direction of movement of the mask during the exposure, wherein $$n = \frac{Y1}{Y2},$$

Figure 1:
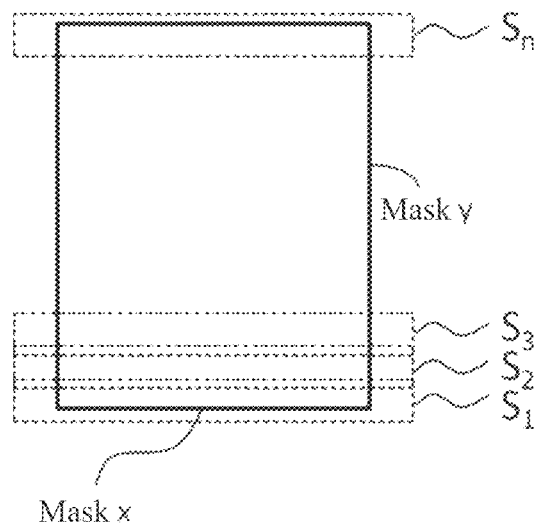
FIG. 1 is a schematic diagram of dividing pattern information on a mask into n areas in the present application.

Y1 is the length of the mask, and Y2 is the width of a light-transmitting slit in the exposure. Referring to FIG. 1, FIG. 1 is a schematic diagram of dividing the pattern information on the mask into the n areas in the present application. In FIG. 1, "mask y" represents the direction along which the mask moves during the exposure, i.e., the length direction of the mask; and "mask x" in FIG. 1 represents the width direction of the mask.

Figure 2:
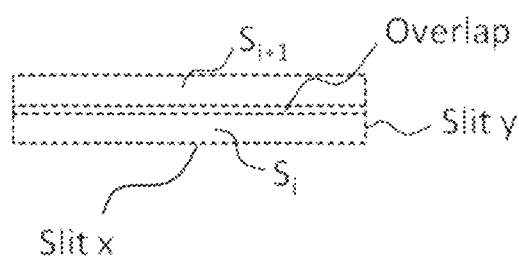
FIG. 2 is a schematic diagram of positional relationships between two adjacent areas and an exposure slit in the present application.

More specifically, in this embodiment of the present application, two adjacent areas in step 2 have an overlap area in the width direction thereof, and the width of the overlap area is 1%-10% of the width of each area. Referring to FIG. 2, FIG. 2 is a schematic diagram of positional relationships between two adjacent areas and an exposure slit in the present application, wherein Si+1 and Si represent the two adjacent areas, and Slit y represents the width of the exposure slit. It can be seen from FIG. 1 and FIG. 2 that the two adjacent areas overlap in the respective width direction. Slit x represents the length of the exposure slit.

More specifically, in this embodiment of the present application, the width of the overlap area in step 2 is 5% of the width of each area.

Step 3. SMO computation is performed on the pattern information in the n areas S1-Sn, so as to generate n SMO files SMO1-SMO2 corresponding to the n areas S1-Sn respectively. The SMO computation is a computation method for source-mask optimization (SMO) illumination. After the SMO computation in step 3, SMO files corresponding to all of the areas are formed, i.e., SMO files SMO1-SMO2 corresponding to the area S1-Sn respectively.

Step 4. Combinatorial optimization is performed on the n SMO files SMO1-SMO2 to obtain a DSMO file.

More specifically, in this embodiment of the present application, the combinatorial optimization is performed on the n SMO files SMO1-SMO2 via a server side (DSMO Server) in step 4, so as to obtain the DSMO file.

Figure 5:
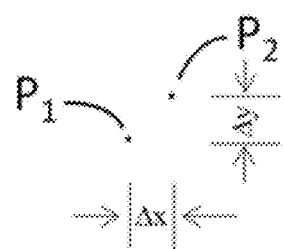
FIG. 5 is a schematic diagram of movement ranges of unit point illuminations of two adjacent SMO illuminations in the present application.

More specifically, in this embodiment of the present application, the server side in step 4 specifies unit point illuminations of two adjacent SMO illuminations, and lateral (x-axial) and longitudinal (y-axial) movement ranges of the two unit point illuminations do not exceed 10% of the radius of the outermost unit point illumination in the two unit point illuminations. Referring to FIG. 5, FIG. 5 is a schematic diagram of movement ranges of unit point illuminations of two adjacent SMO illuminations in the present application, wherein P1 and P2 represents the two adjacent unit point illuminations.

Figure 3:
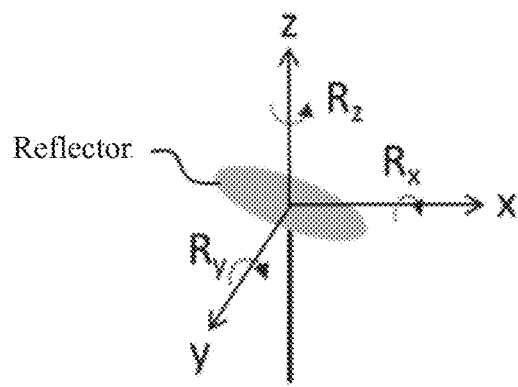
FIG. 3 is a schematic diagram of the position of a reflector in the three-dimensional coordinate system in the present application.

Step 5. A driver $(R_x^1, R_y^1, R_z^1), (R_x^2, R_y^2, R_z^2), \ldots, (R_x^k, R_y^k, R_z^k)$ of a light source reflector array is generated according to the DSMO file, the illumination, and a movement speed of a wafer, wherein k represents the number of reflectors, $R_x^k$, $R_y^k$, and $R_z^k$ respectively represent angles between the k-th reflector and the x, y, and z axes in the three-dimensional coordinate system. Referring to FIG. 3, FIG. 3 is a schematic diagram of the position of a reflector in the three-dimensional coordinate system in the present application, wherein $R_x$, $R_y$, and $R_z$ respectively represent angles between the reflector and the x, y, and z axes.

Figure 4:
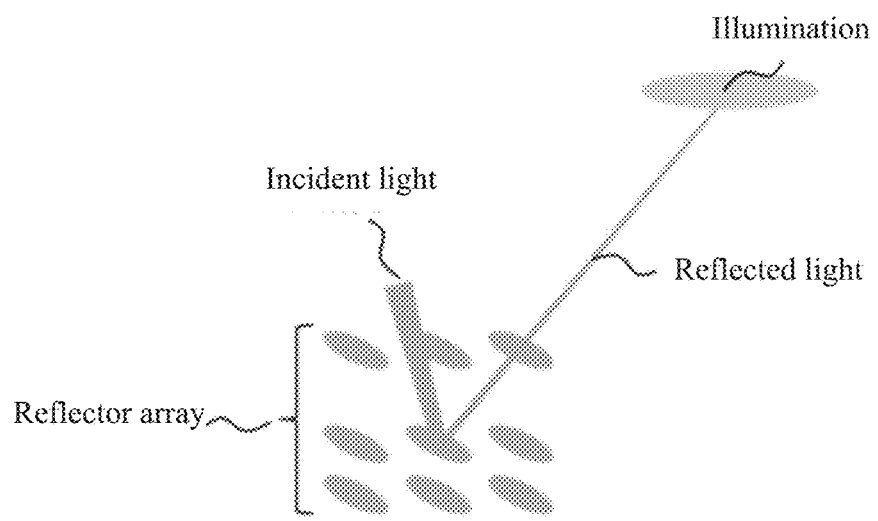
FIG. 4 is a schematic diagram of a reflector array in the present application.

More specifically, in this embodiment of the present application, a reflector array servo system in a lithography machine generates the driver of the reflector array in step 5. Referring to FIG. 4, FIG. 4 is a schematic diagram of the reflector array in the present application.

Figure 6:
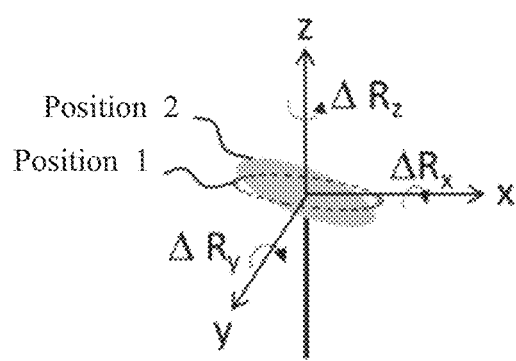
FIG. 6 is a schematic diagram of a reflector rotation range of two adjacent SMO illuminations in the present application.

More specifically, in this embodiment of the present application, the driver of the light source reflector array in step 5 defines a reflector rotation range ($\Delta R_x$, $\Delta R_y$, $\Delta R_z$) of two adjacent SMO illuminations as 0-5 degrees. Referring to FIG. 6, FIG. 6 is a schematic diagram of a reflector rotation range of two adjacent SMO illuminations in the present application. More specifically, in this embodiment of the present application, the driver of the light source reflector array in step 5 defines a reflector rotation range ($\Delta R_x$, $\Delta R_y$, $\Delta R_z$) of two adjacent SMO illuminations as 1 degree.

Step 6. A reflector array of an exposure machine is controlled by calling the driver of the light source reflector array, so as to achieve illumination.

To sum up, the DSMO method of the present application is performed in each exposure slit area, so as to further improve the illumination optimization for a pattern, thereby enlarging a lithography process window and reducing the lithography cost. In particular, in the vicinity of the diffraction limit, in order to expose a pattern having a smaller size, it is necessary to split a mask into several portions. The DSMO may even reduce the number of masks by enlarging the lithography process window. Therefore, the present application effectively overcomes various defects in the prior art and has a high industrial value.

The above embodiments only exemplarily illustrate the principle and effects of the present application, but are not intended to limit the present application. Any person familiar with this technology can modify or change the above embodiments without departing from the spirit and scope of the present application. Therefore, any equivalent modification or change made by those with ordinary knowledge in the technical field without departing from the spirit and technical concept disclosed by the present application shall still be covered by the claims of the present application.

What is claimed is:

1. A dynamic illumination method based on a scan exposure machine, at least comprising the following steps:
   step 1: providing a mask used for exposure and a graphic design system (GDS) file corresponding to the mask;
   step 2: according to data in the GDS file, dividing pattern information on the mask into n areas S1-Sn with the same width along a direction of movement of the mask during the exposure, wherein n=Y1/Y2, Y1 is a length of the mask, and Y2 is a width of a light-transmitting slit in the exposure;
   step 3: performing SMO computation on the pattern information in the n areas S1-Sn, so as to generate n SMO files SMO1-SMO2 corresponding to the n areas S1-Sn respectively;
   step 4: performing combinatorial optimization on the n SMO files SMO1-SMO2 to obtain a dynamic source mask optimization (DSMO) file;
   step 5: generating a driver $(R_x^1, R_y^1, R_z^1), (R_x^2, R_y^2, R_z^2), \ldots, (R_x^k, R_y^k, R_z^k)$ of a light source reflector array according to the DSMO file, the illumination, and a movement speed of a wafer, wherein k represents a number of reflectors, $R_x^k$, $R_y^k$, and $R_z^k$ respectively represent angles between a k-th reflector and x, y, and z axes in a three-dimensional coordinate system; and
   step 6: controlling a reflector array of an exposure machine by calling the driver of the light source reflector array, so as to achieve illumination.

2. The dynamic illumination method based on the scan exposure machine according to claim 1, wherein two adjacent areas in step 2 have an overlap area in a width direction thereof, and a width of the overlap area is 1%-10% of a width of each area.

3. The dynamic illumination method based on the scan exposure machine according to claim 1, wherein a width of an overlap area in step 2 is 5% of a width of each area.

4. The dynamic illumination method based on the scan exposure machine according to claim 1, wherein the combinatorial optimization is performed on the n SMO files SMO1-SMO2 via a server side in step 4, so as to obtain the DSMO file.

5. The dynamic illumination method based on the scan exposure machine according to claim 4, wherein the server side in step 4 specifies unit point illuminations of two adjacent SMO illuminations, and lateral and longitudinal movement ranges of the two unit point illuminations do not exceed 10% of the radius of an outermost unit point illumination in the two unit point illuminations.

6. The dynamic illumination method based on the scan exposure machine according to claim 1, wherein a reflector array servo system in a lithography machine generates the driver of the reflector array in step 5.

7. The dynamic illumination method based on the scan exposure machine according to claim 1, wherein the driver of the light source reflector array in step 5 defines a reflector rotation range ($\Delta R_x$, $\Delta R_y$, $\Delta R_z$) of two adjacent SMO illuminations as 0-5 degrees.

8. The dynamic illumination method based on the scan exposure machine according to claim 1, wherein the driver of the light source reflector array in step 5 defines a reflector rotation range ($\Delta R_x$, $\Delta R_y$, $\Delta R_z$) of two adjacent SMO illuminations as 1 degree.

9. The dynamic illumination method based on the scan exposure machine according to claim 1, wherein the exposure machine in step 6 is a deep ultraviolet (DUV) or extreme ultraviolet (EUV) machine.

* * * * *